United States Patent
Hong et al.

(10) Patent No.: US 9,337,357 B2
(45) Date of Patent: May 10, 2016

(54) BIFACIAL SOLAR CELL MODULE

(75) Inventors: Seeun Hong, Seoul (KR); Youngsik Lee, Seoul (KR); Junoh Shin, Seoul (KR); Byongsu Kim, Seoul (KR); Hwanyeon Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 676 days.

(21) Appl. No.: 13/536,296

(22) Filed: Jun. 28, 2012

(65) Prior Publication Data

US 2013/0167898 A1      Jul. 4, 2013

(30) Foreign Application Priority Data

Jan. 2, 2012  (KR) .................. 10-2012-0000069

(51) Int. Cl.

| H01L 31/02 | (2006.01) |
| H01L 31/042 | (2014.01) |
| H02S 40/34 | (2014.01) |
| H01L 31/068 | (2012.01) |

(52) U.S. Cl.
CPC .......... *H01L 31/0201* (2013.01); *H01L 31/042* (2013.01); *H01L 31/0684* (2013.01); *H02S 40/34* (2014.12); *Y02E 10/50* (2013.01)

(58) Field of Classification Search
CPC .............. H01L 31/0201; H01L 31/042; H01L 31/0684

USPC ......................................................... 136/244
See application file for complete search history.

(56) References Cited

U.S. PATENT DOCUMENTS

| 3,899,359 | A | * | 8/1975 | Stachurski | .................... 136/205 |
| 4,233,085 | A | * | 11/1980 | Roderick et al. | ............... 136/244 |
| 4,513,167 | A | * | 4/1985 | Brandstetter | ................. 136/244 |
| 5,990,413 | A | | 11/1999 | Ortabasi | |
| 2007/0221264 | A1 | * | 9/2007 | Shutoh et al. | ................. 136/224 |
| 2011/0048492 | A1 | * | 3/2011 | Nishiwaki | ..................... 136/244 |
| 2011/0220168 | A1 | | 9/2011 | Park | |

FOREIGN PATENT DOCUMENTS

DE      102006044418 B3    12/2007

* cited by examiner

*Primary Examiner* — Shannon Gardner
(74) *Attorney, Agent, or Firm* — Dentons US LLP

(57) ABSTRACT

A bifacial solar cell module includes a solar cell panel including a plurality of strings arranged in a row direction. Each of the plurality of strings is formed by electrically connecting a plurality of bifacial solar cells arranged adjacent to one another in a column direction using an interconnector. The bifacial solar cell module further includes a plurality of lead wires electrically connecting an interconnector of the bifacial solar cell positioned at an end of each string to a junction box. At least one of the plurality of strings includes the n bifacial solar cells, and other strings not including the n bifacial solar cells include more than n bifacial solar cells, where n is a positive integer equal to or greater than 1.

19 Claims, 7 Drawing Sheets

BIFACIAL SOLAR CELL MODULE

This application claims priority to and the benefit of Korean Patent Application No. 10-2012-0000069 filed in the Korean Intellectual Property Office on Jan. 2, 2012, the entire contents of which are incorporated herein by reference.

BACKGROUND

1. Field of the Disclosure

Embodiments of the disclosure relate to a bifacial solar cell module.

2. Description of the Related Art

Solar power generation to convert light energy into electric energy using a photoelectric conversion effect has been widely used as a method for obtaining eco-friendly energy. A solar power generation system using a plurality of solar cell modules has been installed in places, such as houses, due to an improvement of a photoelectric conversion efficiency of solar cells.

The solar cell module includes a plurality of solar cells, each of which generates electric current by solar light, and protective members, which are disposed on upper parts and lower parts of the solar cells to protect the solar cells from an external environment such as an external impact and moisture.

The solar cell module generally uses a sheet formed of an opaque material as the lower protective member. However, a technology for the solar cell module has been recently developed to use a light transmissive substrate as the lower protective member and to use light incident on both front and back surfaces of bifacial solar cells to produce electric current.

SUMMARY

In one aspect, there is a bifacial solar cell module including a solar cell panel including a plurality of strings arranged in a row direction, each of the plurality of strings being formed by electrically connecting a plurality of bifacial solar cells arranged adjacent to one another in a column direction using an interconnector, and a plurality of lead wires to electrically connect an interconnector of the bifacial solar cell positioned at an end of each string to a junction box, wherein at least one of the plurality of strings includes the n bifacial solar cells, and other strings not including the n bifacial solar cells include more than n bifacial solar cells, where n is a positive integer equal to or greater than 1.

The bifacial solar cell positioned on a first row of the string, which is positioned adjacent to the at least one string including the n bifacial solar cells, and includes the more than n bifacial solar cells, is connected to the bifacial solar cell positioned on a second row of the at least one string including the n bifacial solar cells using the lead wires.

The other strings including the more than n bifacial solar cells include a pair of outer strings positioned at each edge of the solar cell panel and a plurality of inner strings positioned between the pair of outer strings. The at least one string including the n bifacial solar cells is included as one of the plurality of inner strings positioned between the pair of outer strings.

The plurality of inner strings may include first to fourth inner strings positioned between the pair of outer strings. The second and third inner strings may each include the n bifacial solar cells, and the pair of outer strings and the first and fourth inner strings may each include the more than n bifacial solar cells.

In this instance, the bifacial solar cell may not be positioned on a first row of each of the second and third inner strings. The junction box may be positioned on a back surface of the solar cell panel at a location corresponding to the first row of each of the second and third inner strings.

Each of a pair of outer lead wires for electrically connecting the pair of outer strings to the junction box may include an interconnector connector connected to an interconnector of the corresponding outer string and connected to a junction box connector.

In this instance, the interconnector connector and the junction box connector of each outer lead wire may be arranged in a crossing direction to each other.

A first inner lead wire for electrically connecting the first and second inner strings to the junction box may include a first interconnector connector connected to an interconnector of the first inner string, a second interconnector connector which is separated from the first interconnector connector and is connected to an interconnector of the second inner string, a connector connecting the first interconnector connector to the second interconnector connector, and a junction box connector connected to the second interconnector connector.

In this instance, the first interconnector connector and the second interconnector connector may be arranged in the same direction, and the connector and the junction box connector may be arranged in a direction crossing the first and second interconnector connectors.

A second inner lead wire for electrically connecting the third and fourth inner strings to the junction box may include a third interconnector connector connected to an interconnector of the fourth inner string, a fourth interconnector connector which is separated from the third interconnector connector and is connected to an interconnector of the third inner string, a connector connecting the third interconnector connector to the fourth interconnector connector, and a junction box connector connected to the fourth interconnector connector.

In this instance, the third interconnector connector and the fourth interconnector connector may be arranged in the same direction, and the connector and the junction box connector may be arranged in a direction crossing the third and fourth interconnector connectors.

The junction box connector of the first inner lead wire and the junction box connector of the second inner lead wire may be positioned between the junction box connectors of the pair of outer lead wires. The junction box connectors of the pair of outer lead wires may be positioned between the connector and the junction box connector of the first inner lead wire and between the connector and the junction box connector of the second inner lead wire, respectively.

Each of the plurality of bifacial solar cells includes a first electrode and a second electrode which are positioned on different surfaces of a substrate and have different polarities.

According to the above-described characteristics, because the bifacial solar cell is not positioned in the formation area of the junction box, a shading phenomenon resulting from the junction box may be reduced. Hence, an electricity generation performance of the solar cell module may be improved.

BRIEF DESCRIPTION OF THE DRAWINGS

The accompanying drawings, which are included to provide a further understanding of the disclosure and are incorporated in and constitute a part of this specification, illustrate embodiments of the invention and together with the description serve to explain the principles of the invention. In the drawings.

DETAILED DESCRIPTION OF THE EMBODIMENTS

Figure 1:
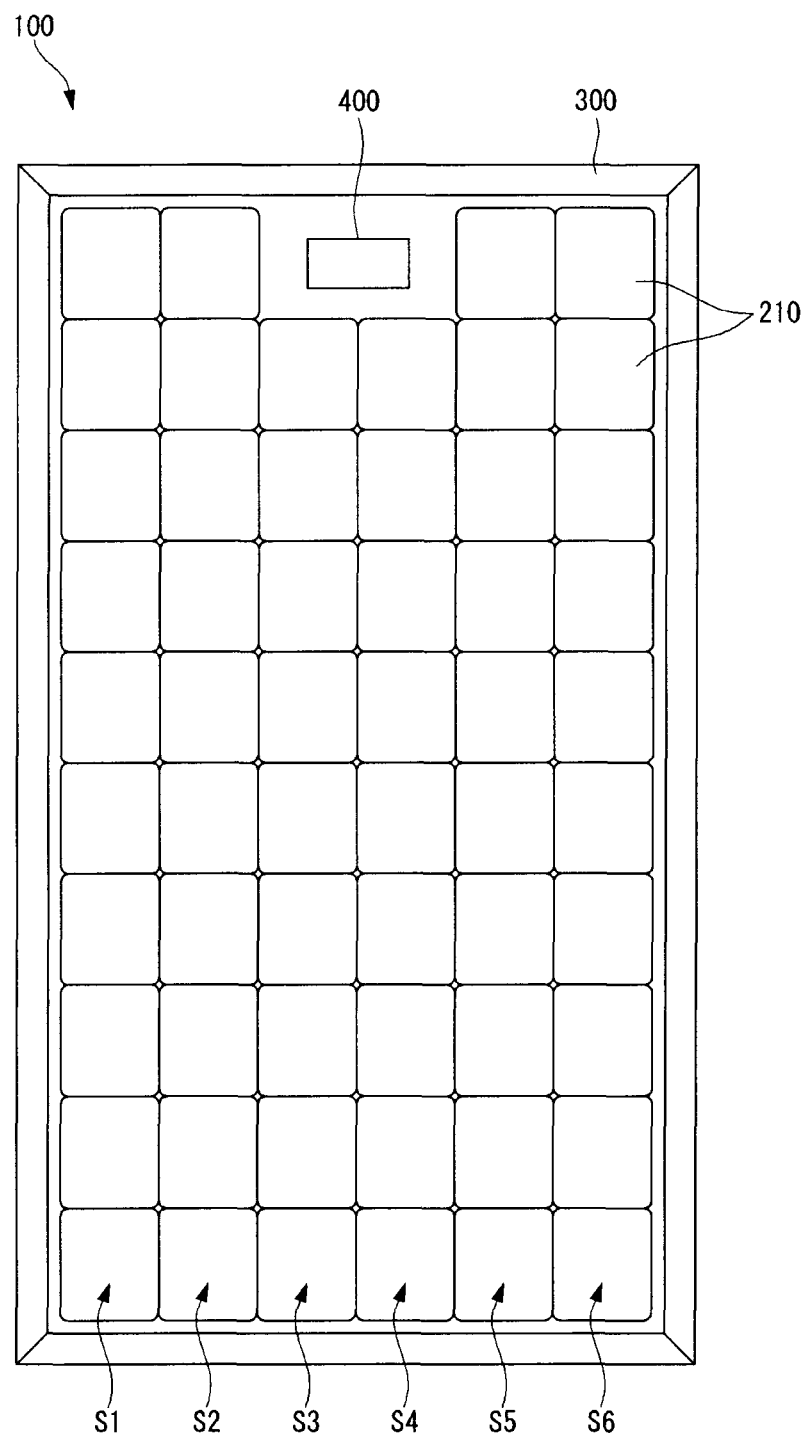
FIG. 1 is a plane view of a bifacial solar cell module according to an example embodiment of the invention.

Reference will now be made in detail to embodiments of the invention, examples of which are illustrated in the accompanying drawings. The invention may, however, be embodied in many different forms and should not be construed as limited to the embodiments set forth herein. Wherever possible, the same reference numbers will be used throughout the drawings to refer to the same or like parts. It should be noted that detailed description of known arts may be omitted if the description does not aid in the understanding of the embodiments of the invention.

In the drawings, the thickness of layers, films, panels, regions, etc., may be exaggerated for clarity. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Further, it will be understood that when an element such as a layer, film, region, or substrate is referred to as being "entirely" on other element, it may be on the entire surface of the other element and may not be on a portion of an edge of the other element.

Example embodiments of the invention will be described in detail with reference to FIGS. 1 to 7.

Figure 2:
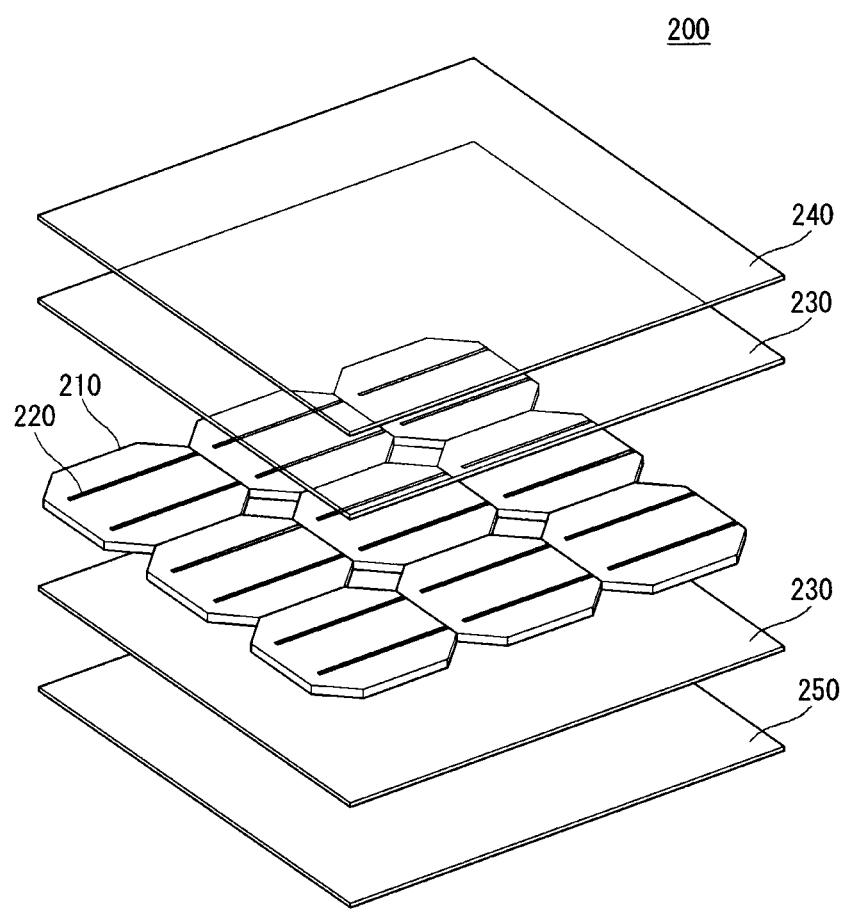
FIG. 2 is a partial exploded perspective view of a solar cell panel shown in FIG. 1.
Figure 3:
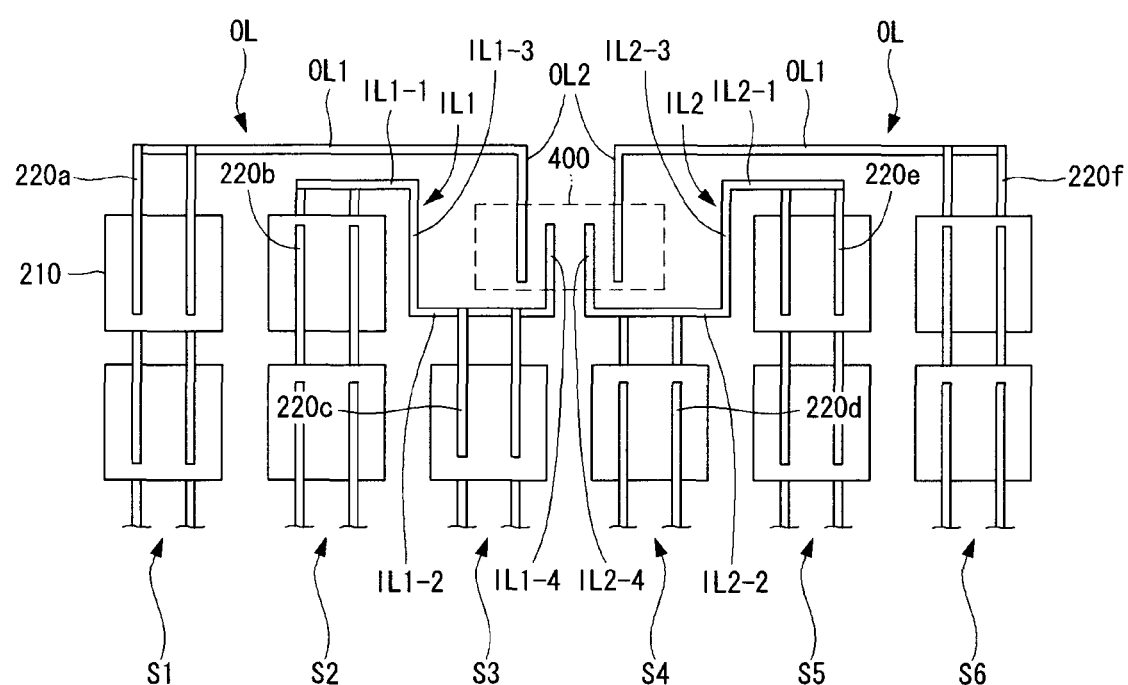
FIG. 3 is a back surface of a main part of a solar cell panel shown in FIG. 1.
Figure 4:
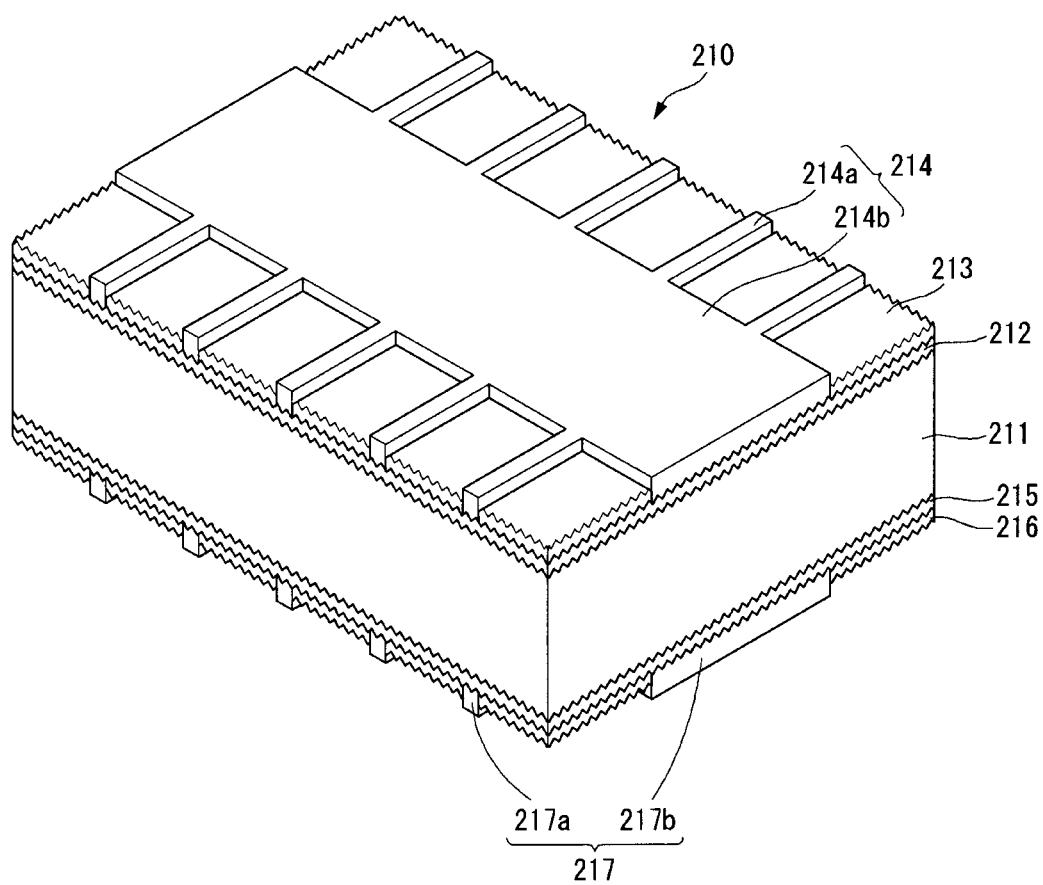
FIG. 4 is a perspective view of a main part of a bifacial solar cell shown in FIG. 1.

FIG. 1 is a plane view of a bifacial solar cell module according to an example embodiment of the invention, and FIG. 2 is a partial exploded perspective view of a solar cell panel shown in FIG. 1. FIG. 3 is a back surface of a main part of a solar cell panel shown in FIG. 1, and FIG. 4 is a perspective view of a main part of a bifacial solar cell shown in FIG. 1.

As shown in FIGS. 1 to 4, a bifacial solar cell module 100 according to the embodiment of the invention includes a solar cell panel 200.

The solar cell panel 200 includes a plurality of bifacial solar cells 210, a plurality of interconnectors 220, each of which electrically connects the bifacial solar cells 210 arranged adjacent to each other in a column direction, protective layers 230 for protecting the bifacial solar cells 210, a light transmissive front substrate 240 positioned on the protective layer 230 on front surfaces of the bifacial solar cells 210, and a light transmissive back substrate 250 positioned on a back surface of the protective layer 230 on back surfaces of the bifacial solar cells 210.

The bifacial solar cell module 100 further includes a frame 300 receiving the above-described components, which may be formed into an integral body through a lamination process, and a junction box 400 for collecting electric power produced by the bifacial solar cells 210.

The light transmissive front substrate 240 and the light transmissive back substrate 250 prevent moisture or oxygen from penetrating into the bifacial solar cell module 100, thereby protecting the bifacial solar cells 210 from an external environment.

The light transmissive front substrate 240 and the light transmissive back substrate 250 are formed of a tempered glass having a high light transmittance and excellent damage prevention characteristics. The tempered glass may be a low iron tempered glass containing a small amount of iron.

The light transmissive front substrate 240 and the light transmissive back substrate 250 may have an embossed inner surface so as to increase a scattering effect of light.

The light transmissive front substrate 240 and the light transmissive back substrate 250 may be formed of a polymer resin. In the embodiment of the invention, polyethylene terephthalate (PET) may be used as the polymer resin.

The protective layers 230 and the bifacial solar cells 210 may form an integral body when the lamination process is performed in a state where the protective layers 230 are respectively positioned on the front surfaces and the back surfaces of the bifacial solar cells 210. The protective layers 230 prevent corrosion of metal resulting from the moisture penetration and protect the bifacial solar cells 210 from an impact.

The protective layers 230 may be formed of ethylene vinyl acetate (EVA) or silicon resin. However, other materials may be used.

As shown in FIG. 4, each of the bifacial solar cells 210 of the solar cell panel 200 according to the embodiment of the invention includes a substrate 211, an emitter region 212 positioned at a first surface, for example, a front surface of the substrate 211, a first anti-reflection layer 213 positioned on the emitter region 212, a first electrode 214 positioned on the emitter region 212 on which the first anti-reflection layer 213 is not positioned, a back surface field (BSF) region 215 positioned at a second surface, for example, a back surface of the substrate 211, a second anti-reflection layer 216 positioned on a back surface of the back surface field region 215, and a second electrode 217 positioned on the back surface of the back surface field region 215 on which the second anti-reflection layer 216 is not positioned.

The substrate 211 is formed of a silicon wafer of a first conductive type, for example, an n-type. Silicon used in the silicon wafer may be single crystal silicon, polycrystalline silicon, or amorphous silicon.

When the substrate 211 is of the n-type, the substrate 211 contains impurities of a group V element such as phosphorus (P), arsenic (As), and antimony (Sb).

Alternatively, the substrate 211 may be of a p-type and/or may be formed of a semiconductor material other than silicon.

If the substrate 211 is of the p-type in another embodiment of the invention, the substrate 211 may contain impurities of a group III element such as boron (B), gallium (Ga), and indium (In).

At least one of the front surface and the back surface of the substrate 211 is textured to form a textured surface corresponding to an uneven surface or having uneven characteristics.

The emitter region 212 positioned at the front surface of the substrate 211 is an impurity region of a second conductive type (for example, p-type) opposite the first conductive type (for example, n-type) of the substrate 211. Thus, the emitter region 212 forms a p-n junction along with the substrate 211.

Carriers, i.e., electron-hole pairs produced by light incident on the substrate 211 are separated into electrons and holes by a built-in potential difference resulting from the p-n junction between the substrate 211 and the emitter region 212. Then, the separated electrons move to the n-type semiconductor, and the separated holes move to the p-type semiconductor.

Thus, when the substrate 211 is of the n-type and the emitter region 212 is of the p-type, the separated electrons move to the substrate 211 and the separated holes move to the emitter region 212. Hence, the electrons become major carriers in the substrate 211, and the holes become major carriers in the emitter region 212.

When the emitter region 212 is of the p-type, the emitter region 212 may be formed by doping impurities of a group III element such as boron (B), gallium (Ga), and indium (In) on the substrate 211.

Alternatively, if the substrate 211 is of the p-type, the emitter region 212 may be of the n-type. In this instance, the separated electrons move to the emitter region 212 and the separated holes move to the substrate 211.

As describe above, if the emitter region 212 is of the n-type in another embodiment of the invention, the emitter region 212 may be formed by doping impurities of a group V element such as phosphorus (P), arsenic (As), and antimony (Sb) on the substrate 211.

The first anti-reflection layer 213 positioned on the emitter region 212 is formed of metal oxide-based material, for example, at least one selected among silicon nitride (SiNx), silicon oxide (SiOx), aluminum oxide (AlOx), and titanium dioxide ($TiO_2$).

The first anti-reflection layer 213 performs an anti-reflection function to reduce a reflectance of light incident through the front surface of the substrate 211 and/or to increase selectivity of a predetermined wavelength band. In addition, the first anti-reflection layer 213 performs a passivation function.

The first electrode 214 is positioned on the emitter region 212, on which the first anti-reflection layer 213 is not positioned.

The first electrode 214 may include a plurality of finger electrodes 214a and a plurality of bus bar electrodes 214b.

The first electrode 214 may be formed through a plating process or a printing process.

When the first electrode 214 is formed through the plating process, the first anti-reflection layer 213 may include a plurality of contact lines exposing a portion of the emitter region 212. The first electrode 214 may be formed on the emitter region 212 exposed by the contact lines of the first anti-reflection layer 213 through the plating process.

The first electrode 214 formed through the plating process may include a metal seed layer, a diffusion barrier layer, and a conductive layer, which are sequentially formed on the emitter region 212. The conductive layer of the first electrode 214 may include a copper layer and a tin layer.

Alternatively, when the first electrode 214 is formed through the printing process, a paste for the first electrode 214 may be printed on the front surface of the substrate 211. Then, the first electrode 214 may be electrically connected to the emitter region 212 by removing the first anti-reflection layer 213 using an etching component contained in the paste during the firing of the paste.

The first electrode 214 collects carriers (for example, holes) moving to the emitter region 212.

The second electrode 217 positioned on the back surface of the substrate 211 collects carriers (for example, electrons) moving to the substrate 211 and outputs the carriers to an external device.

In the embodiment of the invention, the second electrode 217 may have the same structure as the first electrode 214. In other words, the second electrode 217 includes a plurality of finger electrodes 217a formed at a location corresponding to the finger electrodes 214a of the first electrode 214 and a plurality of bus bar electrodes 217b formed at a location corresponding to the bus bar electrodes 214b of the first electrode 214. The second electrode 217 may be formed of the same material as the first electrode 214.

Alternatively, a distance between the finger electrodes 217a of the second electrode 217 may be less than a distance between the finger electrodes 214a of the first electrode 214. In this instance, an increase in a serial resistance of the back surface of the substrate 211 may be prevented.

The back surface field region 215 electrically and physically connected to the second electrode 217 is positioned at the entire back surface of the substrate 211. The back surface field region 215 is a region (for example, an $n^+$-type region) that is more heavily doped than the substrate 211 with impurities of the same conductive type as the substrate 211.

The back surface field region 215 forms a potential barrier by a difference between impurity concentrations of the substrate 211 and the back surface field region 215, thereby preventing or reducing the movement of holes to the back surface of the substrate 211. Hence, a recombination and/or a disappearance of electrons and holes around the surface of the substrate 211 are prevented or reduced.

FIG. 4 illustrates that the back surface field region 215 is formed at the entire back surface of the substrate 211. However, the back surface field region 215 may have the same structure as the second electrode 217. In other words, the back surface field region 215 may be locally formed at the back surface of the substrate 211 at a location corresponding to the second electrode 217.

The second anti-reflection layer 216 is positioned on the back surface of the back surface field region 215, on which the second electrode 217 is not positioned. The second anti-reflection layer 216 is formed of metal oxide-based material, for example, at least one selected among silicon nitride (SiNx), silicon oxide (SiOx), aluminum oxide (AlOx), and titanium dioxide ($TiO_2$) in the same manner as the first anti-reflection layer 213.

When light irradiated onto the bifacial solar cell 210 having the above-described configuration is incident on the substrate 211 through the emitter region 212 and the back surface field region 215, a plurality of electron-hole pairs are generated in the substrate 211 by light energy produced by the light incident on the substrate 211.

Because the front surface and/or the back surface of the substrate 211 are the textured surface, light reflectance in the front surface and the back surface of the substrate 211 is reduced. Further, because both a light incident operation and a light reflection operation are performed on the textured surface of the substrate 211, light is confined in the bifacial solar cell 210. Hence, light absorption increases, and efficiency of the bifacial solar cell 210 is improved.

In addition, because a reflection loss of light incident on the substrate 211 is reduced by the first anti-reflection layer 213 and the second anti-reflection layer 216, an amount of light incident on the substrate 211 further increases.

The electron-hole pairs are separated into electrons and holes by the p-n junction between the substrate 211 and the emitter region 212. Then, the separated electrons move to the n-type substrate 211, and the separated holes move to the p-type emitter region 212.

As described above, the electrons moving to the substrate 211 move to the second electrode 217 through the back surface field region 215, and the holes moving to the emitter region 212 move to the first electrode 214.

Accordingly, when the first electrode 214 of one bifacial solar cell is connected to the second electrode 217 of another bifacial solar cell adjacent to the one bifacial solar cell using electric wires, for example, the interconnector 220, electric current flows through the bifacial solar cells and allows use of the electric current for electric power.

An electrical connection structure of the solar cell panel according to the embodiment of the invention is described in detail below with reference to FIGS. 1 and 3.

FIG. 3 is an enlarged diagram of a distance between the bifacial solar cells 210. However, as shown in FIG. 1, the bifacial solar cells 210 are positioned to be spaced apart from one another at a predetermined distance, for example, a narrow distance less than about 3 mm.

As shown in FIG. 1, the plurality of bifacial solar cells 210 included in the solar cell panel 200 are arranged in a form of strings. In the embodiment of the invention, a string refers to a series of the bifacial solar cells 210, which are arranged adjacent to one another in a column direction and are electrically connected to one another using the interconnector.

Accordingly, the bifacial solar cell module 100 shown in FIGS. 1 and 3 has six strings, for example, first to sixth strings S1 to S6.

In the embodiment of the invention, the first and sixth strings S1 and S6 respectively positioned at both edges of the bifacial solar cell module 100 are referred to as outer strings, and the second, third, fourth, and fifth strings S2, S3, S4, and S5 positioned between the outer strings S1 and S6 are referred to as first, second, third, and fourth inner strings for the sake of brevity and ease of reading.

The plurality of bifacial solar cells 210 included in each of the strings S1 to S6 are electrically connected to one another using the interconnectors 220.

More specifically, in one string, for example, in the first string S1, the bus bar electrodes 214b of the first electrode 214 of one of the plurality of bifacial solar cells 210 positioned adjacent to one another in the column direction are electrically connected to the bus bar electrodes 217b of the second electrode 217 of another bifacial solar cell 210 adjacent to the one bifacial solar cell 210 using the interconnector 120.

Although not shown, the interconnector connected to the bifacial solar cell 210 positioned under the first string S1 is electrically connected to the interconnector connected to the bifacial solar cell 210 positioned under the second string S2. Further, the interconnector connected to the bifacial solar cell 210 positioned on the second string S2 is electrically connected to the interconnector connected to the bifacial solar cell 210 positioned on the third string S3. Further, the interconnector connected to the bifacial solar cell 210 positioned under the third string S3 is electrically connected to the interconnector connected to the bifacial solar cell 210 positioned under the fourth string S4.

In the same manner, the interconnector connected to the bifacial solar cell 210 positioned on the fourth string S4 is electrically connected to the interconnector connected to the bifacial solar cell 210 positioned on the fifth string S5. Further, the interconnector connected to the bifacial solar cell 210 positioned under the fifth string S5 is electrically connected to the interconnector connected to the bifacial solar cell 210 positioned under the sixth string S6.

The interconnector connected to the bifacial solar cell 210 positioned on the first string S1 and the interconnector connected to the bifacial solar cell 210 positioned on the sixth string S6 are connected to the junction box 400.

Accordingly, the plurality of bifacial solar cells 210 included in the solar cell panel 200 are connected in series to one another.

In the bifacial solar cell module 100 having the above-described configuration, the junction box 400 is generally positioned on the back surface of the solar cell panel 200, and thus may cause a shading phenomenon. Hence, the output of the bifacial solar cell 210 positioned a location corresponding to the junction box 400 is lower than the output of the bifacial solar cells 210 positioned in other areas of the solar cell panel 200. Hence, an amount of electricity produced by the bifacial solar cell module 100 is reduced.

To solve the above problem, the shading phenomenon may be reduced by increasing the size of the solar cell panel 200, and at the same time, disposing the junction box 400 on the front surface of the solar cell panel 200. Alternatively, a method for reducing the size of the junction box 400 may be used.

However, when a position of the junction box 400 changes from the back surface to the front surface of the solar cell panel 200, the size of the solar cell panel 200 unnecessarily increases. Further, when the size of the junction box 400 is reduced, a reduction in the shading phenomenon has a limit.

Accordingly, the bifacial solar cell module 100 according to the embodiment of the invention is characterized in that the bifacial solar cell is not disposed at a location corresponding to a formation area of the junction box 400, so as to solve the above problem.

More specifically, in the bifacial solar cell module 100 according to the embodiment of the invention, the number of bifacial solar cells 210 belonging to at least one of the first to fourth inner strings S2 to S5 positioned between the pair of outer strings S1 and S6 (i.e., the first and sixth strings S1 and S6) is less than the number of bifacial solar cells 210 belonging to other string.

For example, FIGS. 1 and 3 illustrate that each of the second and third inner strings S3 and S4 includes the n bifacial solar cells 210, where n is a positive integer equal to or greater than 1, and the outer strings S1 and S6 and the first and fourth inner strings S2 and S5 each include the (n+1) bifacial solar cells 210, which are more than the number of bifacial solar cells 210 belonging to each of the second and third inner strings S3 and S4 by one.

Alternatively, only one of the second and third inner strings S3 and S4 may include the n bifacial solar cells 210 depending on the size of the junction box 400.

Alternatively, the junction box 400 may be disposed at a location corresponding to one of the pair of outer strings S1 and S6. In this instance, the outer string disposed at a location corresponding to the formation area of the junction box 400 may include the n bifacial solar cells 210.

When each of the second and third inner strings S3 and S4 includes the n bifacial solar cells 210, a bifacial solar cell 210 is not positioned on a first row of each of the second and third inner strings S3 and S4, and the junction box 400 is disposed at a location corresponding to the first row of each of the second and third inner strings S3 and S4.

Accordingly, the bifacial solar cell 210 positioned on a first row of the first inner string S2 is connected to the bifacial solar cell 210 positioned on a second row of the second inner string S3 adjacent to the first inner string S2 using a lead wire. Further, the bifacial solar cell 210 positioned on a first row of the fourth inner string S5 is connected to the bifacial solar cell 210 positioned on a second row of the third inner string S4 adjacent to the fourth inner string S5 using a lead wire.

As described above, in the bifacial solar cell module 100 according to the embodiment of the invention, the bifacial solar cell 210 positioned on the first row of the string, which is adjacent to the string including the n bifacial solar cells 210 and includes the (n+1) bifacial solar cells 210, is directly connected to the bifacial solar cell 210 positioned on the second row of the string including the n bifacial solar cells 210 using the lead wire.

Hereinafter, the interconnector for connecting the bifacial solar cells 210 included in the first string S1 is denoted by a reference symbol 220a; the interconnector for connecting the bifacial solar cells 210 included in the second string S2 is denoted by a reference symbol 220b; and the interconnector for connecting the bifacial solar cells 210 included in the third string S3 is denoted by a reference symbol 220c for the sake of brevity and ease of reading.

In the same manner, the interconnector for connecting the bifacial solar cells 210 included in the fourth string S4 is denoted by a reference symbol 220d; the interconnector for connecting the bifacial solar cells 210 included in the fifth string S5 is denoted by a reference symbol 220e; and the interconnector for connecting the bifacial solar cells 210 included in the sixth string S6 is denoted by a reference symbol 220f for the sake of brevity and case of reading.

A pair of outer lead wires OL for connecting the pair of outer strings S1 and S6 to the junction box 400 may include interconnector connectors OL1 connected to the interconnectors 220a and 220f of the pair of outer strings S1 and S6 and junction box connectors OL2 connected to the interconnector connectors OL1, respectively.

In the embodiment of the invention, the interconnector connector of the lead wire connected to the interconnector may be referred to as a bus bar ribbon or a bus bar interconnector.

The interconnector connector OL1 and the junction box connector OL2 of the outer lead wire OL are arranged in a crossing direction between them.

In other words, as shown in FIG. 3, the interconnector connector OL1 is arranged in a row direction, and the junction box connector OL2 is arranged in the column direction.

A first inner lead wire IL1 for connecting the first and second inner strings S2 and S3 to the junction box 400 may include a first interconnector connector IL1-1 connected to the interconnector 220b of the first inner string S2, a second interconnector connector IL1-2 which is separated from the first interconnector connector IL1-1 and is connected to the interconnector 220c of the second inner string S3, a connector IL1-3 for connecting the first interconnector connector IL1-1 to the second interconnector connector IL1-2, and a junction box connector IL1-4 connected to the second interconnector connector IL1-2.

The first interconnector connector IL1-1 and the second interconnector connector IL1-2 are arranged in the same direction, for example, in the row direction. The connector IL1-3 and the junction box connector IL1-4 are arranged in a direction crossing the first and second interconnector connectors IL1-1 and IL1-2, for example, in the column direction.

In the same manner, a second inner lead wire IL2 for connecting the third and fourth inner strings S4 and S5 to the junction box 400 may include a third interconnector connector IL2-1 connected to the interconnector 220e of the fourth inner string S5, a fourth interconnector connector IL2-2 which is separated from the third interconnector connector IL2-1 and is connected to the interconnector 220d of the third inner string S4, a connector IL2-3 for connecting the third interconnector connector IL2-1 to the fourth interconnector connector IL2-2, and a junction box connector IL2-4 connected to the fourth interconnector connector IL2-2.

The third interconnector connector IL2-1 and the fourth interconnector connector IL2-2 are arranged in the same direction, for example, in the row direction. The connector IL2-3 and the junction box connector IL2-4 are arranged in a direction crossing the third and fourth interconnector connectors IL2-1 and IL2-2, for example, in the column direction.

As described above, a shape of the first inner lead wire IL1 is symmetrical to a shape of the second inner lead wire IL2.

Accordingly, the junction box connector IL1-4 of the first inner lead wire IL1 and the junction box connector IL2-4 of the second inner lead wire IL2 may be positioned between the junction box connectors OL2 of the pair of outer lead wires OL. The junction box connectors OL2 of the pair of outer lead wires OL are respectively positioned between the connector IL1-3 and the junction box connector IL1-4 of the first inner lead wire IL1 and between the connector IL2-3 and the junction box connector IL2-4 of the second inner lead wire IL2.

As described above, each of the pair of outer lead wires OL, the first inner lead wire IL1, and the second inner lead wire IL2 may be configured to be divided into several parts. Alternatively, each of the lines OL, IL1 and IL2 may be configured as one body.

The following Table 1 indicates measure values obtained through an experiment for comparing an electricity generation amount of a related art bifacial solar cell module with an electricity generation amount of the bifacial solar cell module according to the embodiment of the invention. In the experiment for the following Table 1, the related art bifacial solar cell module included first to sixth strings each having ten bifacial solar cells. Further, the bifacial solar cell module according to the embodiment of the invention included second and third inner strings each having nine bifacial solar cells and a pair of outer strings and first and fourth inner strings each having ten bifacial solar cells.

TABLE 1

| | | 7 AM | 8 AM | 9 AM | 10 AM | 11 AM |
|---|---|---|---|---|---|---|
| Electricity generation amount (Kwh/Kwp) | Related art | 2.5 | 2.6 | 2.8 | 3 | 3.4 |
| | Present embodiment | 2.8 | 2.9 | 3.3 | 3.5 | 3.9 |

As indicated by the above Table 1, the number of bifacial solar cells in the bifacial solar cell module according to the embodiment of the invention was less than the number of bifacial solar cells in the related art bifacial solar cell module by two. However, the electricity generation amount of the bifacial solar cell module according to the embodiment of the invention increased compared to the related art bifacial solar cell module.

As a result, the bifacial solar cell module according to the embodiment of the invention may increase the electricity generation amount while reducing the manufacturing cost.

Further, as shown in FIG. 3, when the pair of outer lead wires OL, the first inner lead wire IL1, and the second inner lead wire IL2 are arranged not to overlap the bifacial solar cells 210, an insulation film for providing insulation between the lead wires and/or insulation between the lead wire and the bifacial solar cell is not required.

Accordingly, the manufacturing cost of the bifacial solar cell module 100 may be further reduced, and an increase in the number of manufacturing processes resulting from the use of the insulation film may be prevented.

Further, a colored film may be attached to the back surface of the solar cell panel 200, where the junction box 400 will be attached, and then the junction box 400 may be attached. Hence, the junction box 400 may not be observed in the front of the bifacial solar cell module 100. As a result, an appearance of the bifacial solar cell module 100 may be improved.

Figure 5:
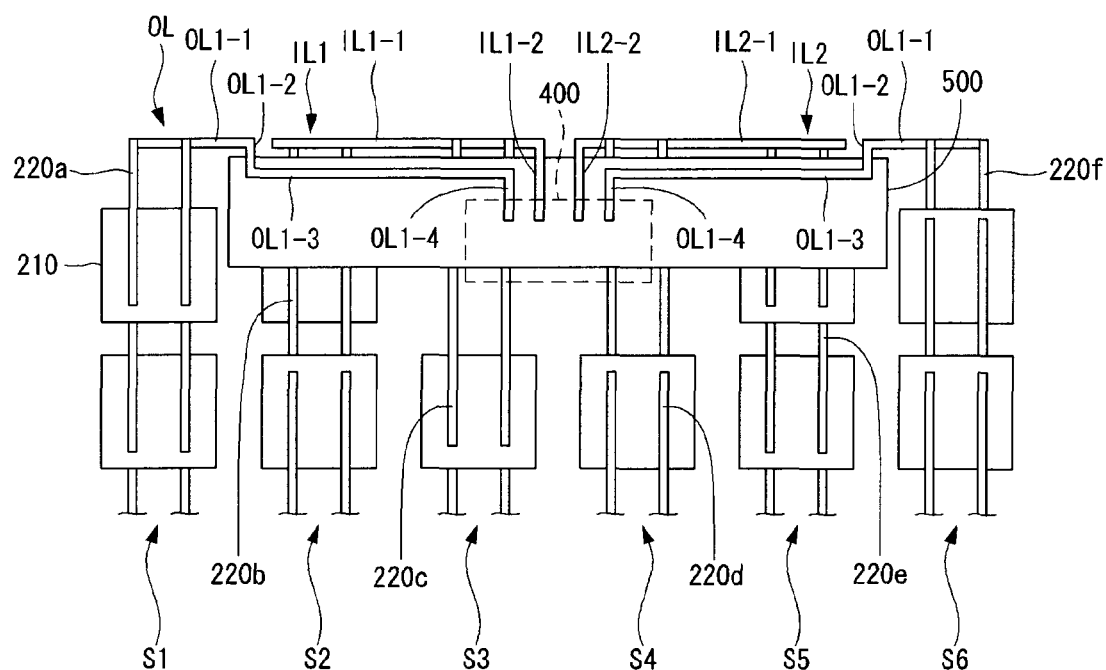
FIGS. 5 to 7 are back views of a main part of a solar cell panel according to various example embodiments of the invention.
Figure 6:
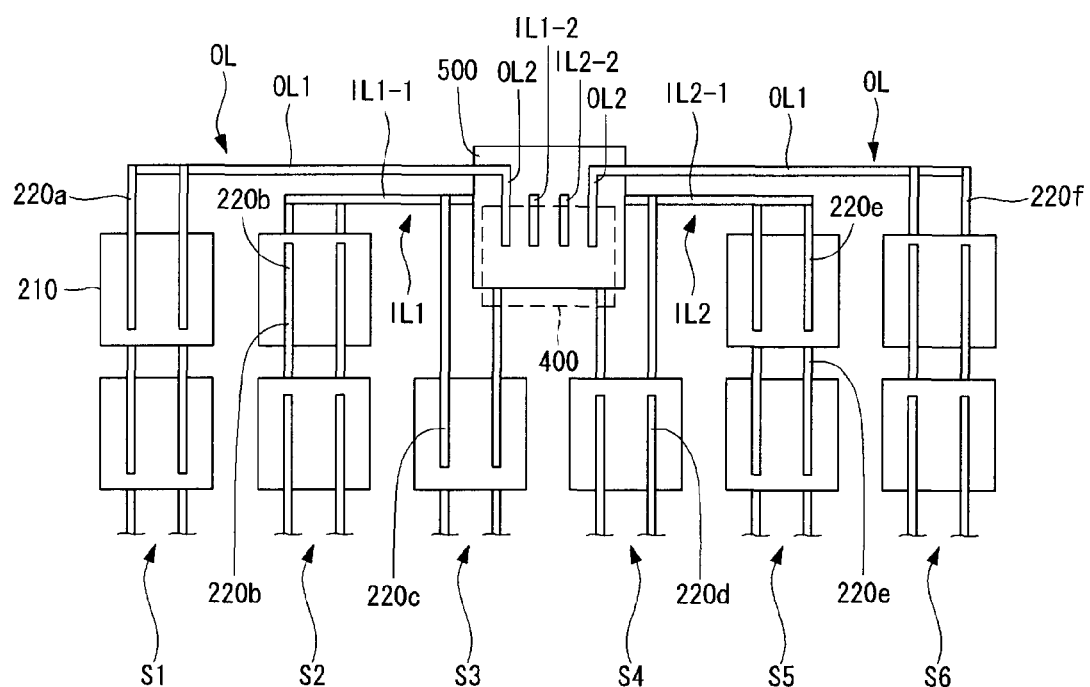
Figure 7:
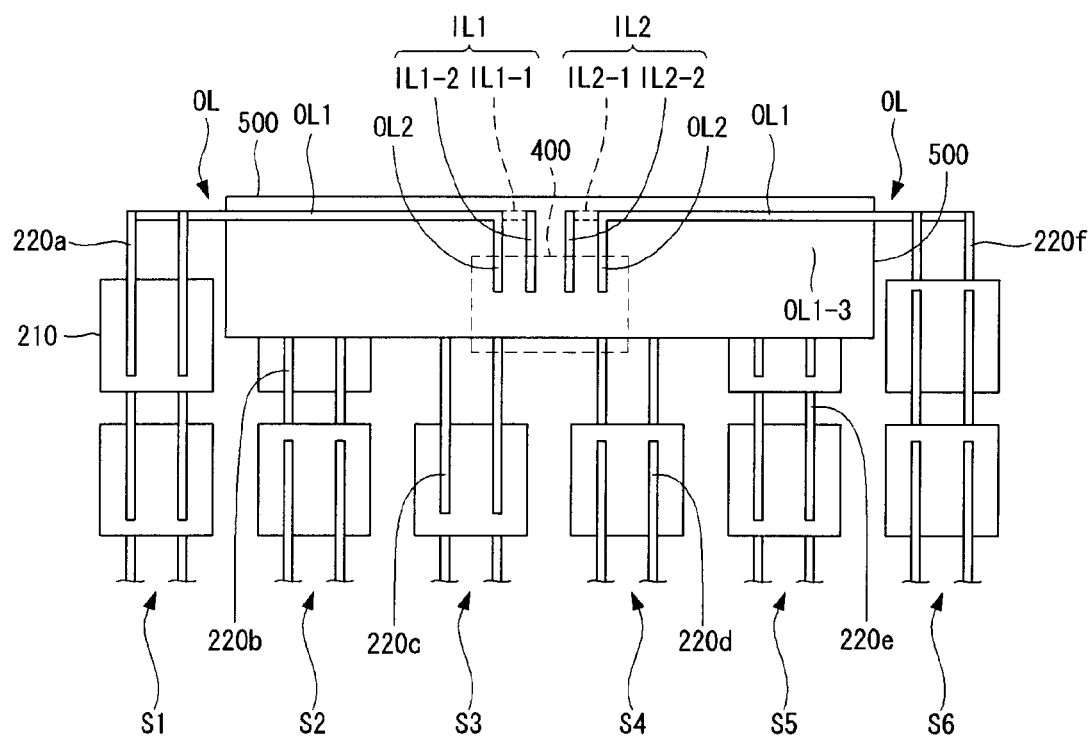

FIGS. 5 to 7 are back views of a main part of a solar cell panel according to another example embodiment of the invention.

In a solar cell panel shown in FIGS. 5 to 7, at least a portion of an outer lead wire OL overlaps a portion of at least one of a first inner lead wire IL1, a second inner lead wire IL2, and a bifacial solar cell 210, and an insulation film 500 is used to prevent an electric short circuit resulting from an overlap between the lead wires and/or an overlap between the lead wire and the bifacial solar cell 210.

First, in a configuration of the solar cell panel shown in FIG. 5, the outer lead wire OL has a stepped structure. More specifically, the outer lead wire OL includes an interconnector connector OL1-1, a junction box connector OL1-4, and connectors OL1-2 and OL1-3 for connecting the interconnector connector OL1-1 to the junction box connector OL1-4.

The first inner lead wire IL1 includes an interconnector connector IL1-1 and a junction box connector IL1-2. The second inner lead wire IL2 includes an interconnector connector IL2-1 and a junction box connector IL2-2.

The insulation film 500 is positioned in a space between the outer lead wire OL and the bifacial solar cell 210. A width of the insulation film 500 is greater than a distance between the connectors OL1-2 of the pair of outer lead wires OL.

Accordingly, the outer lead wire OL is not electrically short circuited to the bifacial solar cell 210, the first inner lead wire IL1 and the second inner lead wire IL2.

Alternatively, as shown in FIG. 6, each of the pair of outer lead wire OL has the same structure as the outer lead wire shown in FIG. 3. Further, the first inner lead wire IL1 and the second inner lead wire IL2 may have the same structure as the outer lead wire OL shown in FIG. 6.

In other words, the first inner lead wire IL1 includes an interconnector connector IL1-1 and a junction box connector IL1-2, and the second inner lead wire IL2 includes an interconnector connector IL2-1 and a junction box connector IL2-2.

The interconnector connector IL1-1 of the first inner lead wire IL1 and the interconnector connector IL2-1 of the second inner lead wire IL2 are arranged closer to the bifacial solar cell 210 than interconnector connectors OL1 of the outer lead wires OL. Namely, the interconnector connectors IL1-1 and IL2-1 of the first and second inner lead wires IL1 and IL2 and the interconnector connectors OL1 of the outer lead wire OL are arranged in two rows.

The insulation film 500 is positioned between the outer lead wire OL and the first and second inner lead wires IL1 and IL2. A width of the insulation film 500 is greater than a distance between junction box connectors OL2 of the pair of outer lead wires OL.

The junction box connector IL1-2 of the first inner lead wire IL1 and the junction box connector IL2-2 of the second inner lead wire IL2 are exposed to an upper surface of the insulation film 500 through a hole formed in the insulation film 500.

Accordingly, the outer lead wires OL are electrically short circuited to the first inner lead wire IL1 and the second inner lead wire IL2.

FIG. 7 is a back view of a main part of a solar cell panel according to a modification of FIG. 6. The outer lead wires OL, the first inner lead wire IL1, and the second inner lead wire IL2 shown in FIG. 7 may have the same shape as those shown in FIG. 6.

However, the interconnector connector IL1-1 of the first inner lead wire IL1 and the interconnector connector IL2-1 of the second inner lead wire IL2 are arranged in the same row as the interconnector connectors OL1 of the outer lead wire OL.

The insulation film 500 is positioned in a space between the outer lead wire OL and the bifacial solar cell 210. A width of the insulation film 500 is greater than a distance between an end of the interconnector connector IL1-1 of the first inner lead wire IL1 and an end of the interconnector connector IL2-1 of the second inner lead wire IL2.

The end of the interconnector connector IL1-1 of the first inner lead wire IL1 may be a portion connected to the interconnector 220b for connecting the bifacial solar cells 210 belonging to the first inner string S2. The end of the interconnector connector IL2-1 of the second inner lead wire IL2 may be a portion connected to the inter connector 220e for connecting the bifacial solar cells 210 belonging to the fourth inner string S5.

The junction box connector IL1-2 of the first inner lead wire IL1 and the junction box connector IL2-2 of the second inner lead wire IL2 are exposed to an upper surface of the insulation film 500 through a hole formed in the insulation film 500.

Accordingly, the outer lead wires OL are electrically short circuited to the bifacial solar cells 210, the first inner lead wire IL1 and the second inner lead wire IL2.

The insulation film 500 may be colored with the same color as the substrate of the bifacial solar cell 210, so as to prevent the junction box from being observed in the front of the solar cell module.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A bifacial solar cell module comprising:
   a solar cell panel including a plurality of bifacial solar cells arranged in a column and a row;
   a front substrate on a front side of the plurality of bifacial solar cells;
   a back substrate on a back side of the plurality of bifacial solar cells;
   a first protective layer between the plurality of bifacial solar cells and the front substrate;
   a second protective layer between the plurality of bifacial solar cells and the back substrate;
   a plurality of strings, each of the plurality of strings comprising a series of bifacial solar cells adjacent to each other electrically connecting the plurality of bifacial solar cells adjacent to each another in the column using an interconnector;
   a plurality of lead wires to electrically connect an interconnector of the plurality of bifacial solar cell at an end of the plurality of strings to an adjacent string; and
   a junction box connecting the plurality of lead wires on a back side of the back substrate,
   wherein the junction box and the plurality of bifacial solar cells are not overlapped,
   wherein a number of bifacial solar cells in one of the plurality of strings in a region where the junction box is located is smaller than a number of bifacial solar cell in another one of the plurality of strings in a region where the junction box is not located, and
   wherein the other of the strings is located at an outer portion of the solar panel and the one of the plurality of strings is located at an inner portion of the solar panel.

2. The bifacial solar cell module of claim 1, wherein one of the plurality of bifacial solar cells on a first row of one of the plurality of strings includes more than n bifacial solar cells is adjacent to another one of the plurality of strings that includes n bifacial solar cells and, is connected to one of the plurality of bifacial solar cell on a second row of the n bifacial solar cells of the other of the plurality of strings using the lead wires.

3. The bifacial solar cell module of claim 1, wherein the other of the plurality of strings which include more than n bifacial solar cells include a pair of outer strings at each edge of the solar cell panel, and
wherein the one of the plurality of strings which n bifacial solar cells are inner strings between the pair of outer strings.

4. The bifacial solar cell module of claim 3, wherein the inner strings include first, second, third, and fourth inner strings.

5. The bifacial solar cell module of claim 4, wherein a first row of each of the second and third inner strings does not include a bifacial solar cell.

6. The bifacial solar cell module of claim 5, wherein the junction box is positioned on a back surface of the solar cell panel at a location corresponding to the first row of each of the second and third inner strings.

7. The bifacial solar cell module of claim 6, wherein each of a pair of outer lead wires for electrically connecting the pair of outer strings to the junction box includes an interconnector connector connected to an interconnector of the corresponding outer string and connected to a junction box connector.

8. The bifacial solar cell module of claim 7, wherein the interconnector connector and the junction box connector of each outer lead wire are arranged in a crossing direction to each other.

9. The bifacial solar cell module of claim 7, wherein the plurality of lead wires include a first inner lead wire to electrically connect the first and second inner strings to the junction box, the first inner lead wire including a first interconnector connector connected to an interconnector of the first inner string, a second interconnector connector which is separated from the first interconnector connector and is connected to an interconnector of the second inner string, a first connector connecting the first interconnector connector to the second interconnector connector, and a junction box connector of the first inner lead wire connected to the second interconnector connector.

10. The bifacial solar cell module of claim 9, wherein the first interconnector connector and the second interconnector connector are arranged in the same direction, and the first connector and the junction box connector of the first inner lead wire are arranged in a direction crossing the first and second interconnector connectors.

11. The bifacial solar cell module of claim 10, wherein the plurality of wires include a second inner lead wire to electrically connect the third and fourth inner strings to the junction box and includes a third interconnector connector connected to an interconnector of the fourth inner string, a fourth interconnector connector which is separated from the third interconnector connector and is connected to an interconnector of the third inner string, a second connector connecting the third interconnector connector to the fourth interconnector connector, and a junction box connector of the second inner lead wire connected to the fourth interconnector connector.

12. The bifacial solar cell module of claim 11, wherein the third interconnector connector and the fourth interconnector connector are arranged in the same direction, and the second connector and the junction box connector of the second inner lead wire are arranged in a direction crossing the third and fourth interconnector connectors.

13. The bifacial solar cell module of claim 12, wherein the first junction box connector of the first inner lead wire and the second junction box connector of the second inner lead wire are positioned between the junction box connectors of the pair of outer lead wires.

14. The bifacial solar cell module of claim 12, wherein the junction box connectors of the pair of outer lead wires are positioned between the first connector and the first junction box connector of the first inner lead wire and between the second connector and the second junction box connector of the second inner lead wire, respectively.

15. The bifacial solar cell module of claim 1, further comprising an insulation film to prevent an electrical short circuit between the plurality of lead wires or an electrical short circuit between the plurality of lead wires and the plurality of bifacial solar cells.

16. The bifacial solar cell module of claim 15, wherein the plurality of lead wires include an outer lead wire, a first inner lead wire, and a second inner lead wire, and at least a portion of the outer lead wire overlaps a portion of at least one of the first inner lead wire and the second inner lead wire, wherein the insulation film is positioned between the outer lead wire and at least one of the first inner lead wire and the second inner lead wire to prevent the electrical short circuit resulting from the overlap.

17. The bifacial solar cell module of claim 15, wherein the insulation film is positioned in a space between the plurality of lead wires and the plurality of bifacial solar cells to prevent the electric short circuit resulting from the overlap between a portion of the plurality of lead wires and a portion of the plurality of bifacial solar cells.

18. The bifacial solar cell module of claim 15, wherein the insulation film is colored in a same color as a substrate of the plurality of bifacial solar cells.

19. The bifacial solar cell module of claim 1, wherein each of the plurality of bifacial solar cells includes a first electrode and a second electrode which are positioned on different surfaces of a substrate and have different polarities.

* * * * *